United States Patent [19]

Irvine et al.

[11] Patent Number: 4,650,539

[45] Date of Patent: Mar. 17, 1987

[54] MANUFACTURE OF CADMIUM MERCURY TELLURIDE

[75] Inventors: Stuart J. C. Irvine; John B. Mullin, both of Malvern, England

[73] Assignee: The Secretary of State for Defence in Her Britannic Majesty's Government of the United Kingdom of Great Britain and Northern Ireland, London, England

[21] Appl. No.: 430,620

[22] Filed: Sep. 30, 1982

Related U.S. Application Data

[63] Continuation of Ser. No. 266,046, May 21, 1981, abandoned.

[30] Foreign Application Priority Data

May 27, 1980 [GB] United Kingdom ............... 8017334

[51] Int. Cl.⁴ .................. C23C 13/08; H01L 21/04; C04B 35/00
[52] U.S. Cl. ...................... 156/613; 118/725; 252/62.3 R; 252/62.3 ZT; 423/561 B; 427/87; 427/255.2; 156/DIG. 72; 156/DIG. 82
[58] Field of Search .............. 156/613, 614, DIG. 72, 156/DIG. 82, DIG. 87; 427/85-87, 91, 255.2, 175; 422/247; 252/62.3 S, 62.3 R; 118/716, 725, 726

[56] References Cited

U.S. PATENT DOCUMENTS

| | | | |
|---|---|---|---|
| 3,218,203 | 11/1965 | Ruehrwein . | |
| 3,312,571 | 4/1967 | Ruehrwein | 148/175 |
| 3,619,283 | 11/1971 | Carpenter et al. | 156/614 |
| 3,664,866 | 5/1972 | Manasevit | 428/700 |
| 3,725,135 | 4/1973 | Hager et al. . | |
| 3,779,803 | 12/1973 | Lee et al. | 357/30 |
| 4,105,478 | 8/1978 | Johnson | 148/188 |
| 4,439,267 | 3/1984 | Jackson, Jr. | 156/614 |

OTHER PUBLICATIONS

Willardson et al, v 18, Semiconductors and Semimetals, 1981, Academic Press.
The Use of Metal-Organics in the Preparation of Semiconductor Materials, Manasevit et al, J. Electrochem. Soc. Solid State Sci., vol. 118, Apr. 71, pp. 644-647.
Kuech et al, "Low Temperature CVD Growth of Epitaxial ThTe on CdTe", J. Electrochem. Soc.: Solid-State Science and Technology, May 1981, vol. 128, No. 5, pp 1142-1144.

*Primary Examiner*—Gary P. Straub
*Attorney, Agent, or Firm*—Cushman, Darby & Cushman

[57] ABSTRACT

A layer of $Cd_xHg_{1-x}Te$ is grown on the surface of a substrate by decomposing alkyls of cadmium and telluride in a mercury atmosphere. The substrate is placed in a vessel containing a mercury bath with the vessel and bath at a suitable pressure and a temperature below the alkyl decomposition temperature. Hydrogen is passed through bubblers separately containing alkyls of cadmium, telluride and, if required, a dopant into the vessel. The substrate is independently heated above the temperature of the vessel so that the alkyls decompose on the substrate. The substrate may be CdTe, a II–VI compound or mixed II–VI alloy. The alkyls may be dimethyl cadmium, diethyl cadmium, dipropyl cadmium, dimethyl telluride, diethyl telluride, dipropyl telluride, dibutyl telluride etc., or hydrogen substituted tellurium alkyls such as hydrogen ethyl telluride etc.

5 Claims, 1 Drawing Figure

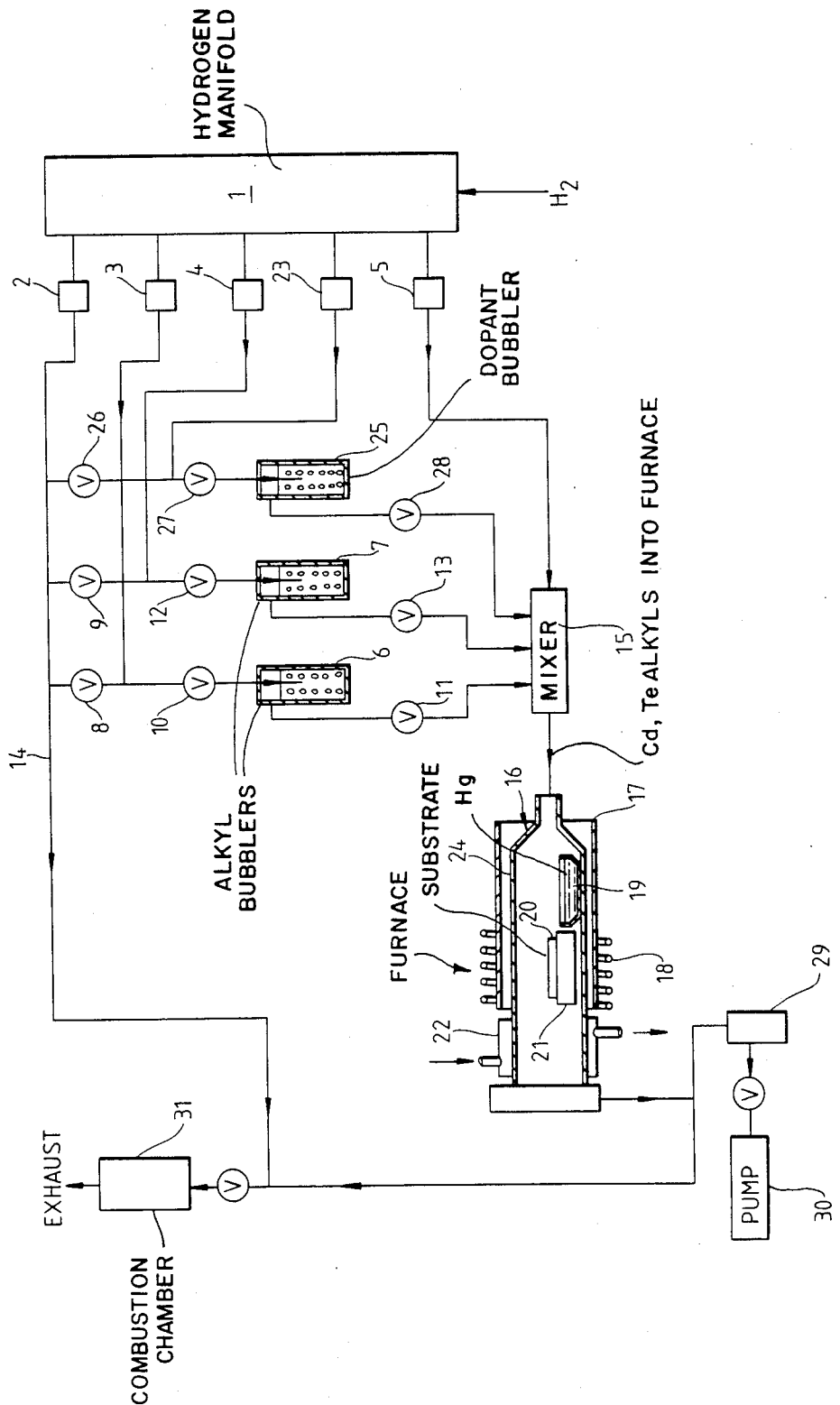

MANUFACTURE OF CADMIUM MERCURY TELLURIDE

This is a continuation of application Ser. No. 266,046 filed May 21, 1981, now abandoned.

The invention relates to the manufacture of the material cadmium, mercury telluride i.e. $Cd_xHg_{1-x}Te$ commonly referred to as CMT or MCT.

Such a material in its semiconducting form is used as a detector of infra red radiation in thermal imaging systems. These detectors comprise small pieces of CMT cut and polished flat with electrical contacts. U.K. Patent Specification No. 859,588, published Jan. 25, 1961, describes the production and use of CMT detectors.

At present CMT appears to be the most useful of all infra red detectors and is therefore used in the majority of high performance thermal imager systems.

CMT is a difficult material to grow and handle, partly because of the volatile nature of the components.

Present methods of manufacture can be broadly classified into bulk melt growth and epitaxial methods.

The most important melt growth methods are: the Bridgman method involving growth in a sealed container carried out in a vertical or horizontal manner; the cast quench anneal method; a cast recrystallise anneal method; and a so-called slush method. All these methods involve batch preparation that is lengthy and expensive taking weeks rather than days to complete. A further disadvantage is that the crystals produced are roughly cylindrical and need slicing, grinding, lapping, etching and dicing into small pieces for use as e.g. detectors.

Epitaxial methods of manufacturing semiconductors on the other hand are intrinsically quicker in so far as they produce thin layers of semiconductor material onto a substrate directly often in a matter of hours or minutes. In the case of materials like GaAs, InP, and GaP well developed methods are available for the growth of homoepitaxial layers of these compounds onto substrates of the parent semiconductor by either liquid or vapour phase processes. However no such well developed art is available in the case of CMT.

In the case of the epitaxial growth of CMT from the liquid it has been reported by Harman, J. Electronic Materials 8 (1979) 191; and by Schmit and Bowers, Appl. Phys. Letters 35 (1979) 457; and by Wang et al, J. Electrochem. Soc. 127 (1980) 175; and by Bowers et al, I.E.E.E. Trans. Electron Devices ED 27 (1980) 24; and by Wang et al, I.E.E.E. Trans. Electron Devices ED 27 (1980) 154; that it is possible to grow layers of CMT from supersaturated solutions in excess tellurium or mercury onto substrates of cadmium telluride (CdTe). Such processes demand considerable skill and a very long development period. The epitaxial layers frequently suffer from surface blemishes which can render them useless for device fabrications. Such methods also suffer a fundamental limitation in respect of composition control i.e. the value of x (in $Cd_xHg_{1-x}Te$) cannot be independently controlled. Thus to produce epitaxial layers having different values of x it is necessary to use differently composed solutions of CMT in Te.

A vapour phase epitaxial (VPE) process for growing CMT has been reported by Vohl & Wolfe (J. Electronic Materials, 7 (1978) 659).

This uses an open flow process with independently controlled sources of the elements Cd, Hg, and Te. However this method suffers a fundamental limitation in the inability to effect adequate control of the values of x at the low deposition temperature that is needed to produce CMT particularly in the important range $x = 0.2-0.3$. Because of the low vapour pressure of Cd and Te in the region of 400° C. the input vapours can suffer a capricious reduction in composition before they reach the substrate. When the substrate is held at a temperature suitable for epitaxial CMT growth the temperature gradient in the deposition chamber is not high enough to prevent condensation of CdTe upstream from the substrate.

Epitaxial layers of CMT have also been produced by subliming sources of HgTe onto a CdTe substrate in close proximity—so-called close-spaced epitaxy—with or without the presence of additional Hg. Examples include the work Cohen-Solal and co-workers, and Tufte and Stelzer. References to these works can be found in J. Appl. Phys. 40 (1969).

This technique relies on the production of CMT by the interdiffusion of Cd and Hg between the substrate and the epitaxial layer. It suffers from the problem of compositional non-uniformity in the direction normal to the plane of the layer. It does not have the advantages of independent control of composition enjoyed by an open flow technique.

Epitaxial layers of GaAs have been grown successfully by VPE using gallium alkyl and arsine.

This contrasts with the situation concerning CMT where it is common knowledge that the attempted growth of CMT using the three alkyls of the elements Cd, Hg and Te in combination has not been successful.

Although there has been a need, since 1961, for a relatively simple method of growing CMT the existing techniques of bulk growth, and epitaxial growth have proved inadequate in terms of speed of preparation and in the versatility of growing material of the desired composition. There is a need therefore to provide an effective method of manufacturing layers of CMT which method allows independent control of the composition $Cd_xHg_{1-x}Te$ and that preferably allows for independent control of doping.

According to this invention a method of growing a layer of the ternary alloy cadmium mercury telluride onto a substrate comprises the steps of:

providing an atmosphere of mercury vapour at a required temperature and pressure inside a vessel;

controlling the temperature of the substrate mounted in the vessel;

providing the supply of a volatile cadmium compound into the vessel and onto the substrate;

providing a supply of a volatile tellurium compound into the vessel and onto the substrate;

the arrangement being such that the cadmium and the tellurium compounds decompose in the region of the substrate and the cadmium and tellurium combine with mercury on the substrate to form a layer of cadmium mercury telluride whose cadmium composition is controlled by the supply of cadmium and the overall composition of the cation content is controlled by the supply of tellurium compound, the mercury vapour pressure being held greater than the decomposition pressure of the growing layer.

The grown layer may be a single epitaxial layer or multiple layers. Such a layer or layers may be graded in composition. The layer or layers may also be suitably doped. For example two layers may be grown with two different values of x so that a detector, sensitive to both the 3 to 5 and 8 to 14 μm wavebands may be made. Also a passivating layer of CdTe may be grown on the $Cd_xHg_{1-x}Te$ layer. Suitable II-VI compounds or mixed alloys may be grown on the layer e.g. CdTe, ZnS, $CdTe_xSe_{(1-x)}$ which may be used to make heterojunctions or form antireflection coatings, etc.

The substrate may be CdTe, a II-VI compound or mixed II-VI alloy. The substrate may be silicon (Si), gallium arsenide (GaAs), spinel ($MgAl_2O_4$), alumina or sapphire ($Al_2O_3$), etc.

The volatile cadmium compound may be an alkyl such as dimethyl cadmium, diethyl cadmium, or dipropyl cadmium, etc.

The volatile tellurium compound may be an alkyl such as diethyl telluride, dimethyl telluride, dipropyl telluride, or dibutyl telluride, etc., or equivalent hydrogen substituted tellurium alkyls, such as, e.g. hydrogen ethyl telluride [$H(C_2H_5)Te$].

Apparatus for growing a layer of cadmium, mercury telluride according to the method of this invention, comprises a vessel containing a substrate, heating means for heating the vessel, a substrate heater, a means for supplying a mercury vapour inside the vessel, means for supplying a cadmium alkyl into the vessel, and means for supplying a tellurium alkyl or hydrogen substituted tellurium alkyl into the vessel, the arrangement being such that the cadmium and tellurium compounds decompose in the mercury atmosphere to form the compound $Cd_xHg_{1-x}Te$ on the surface of the substrate.

The mercury vapour may be provided by a bath of mercury inside the vessel adjacent to the substrate.

The vessel heater may be an electrical resistance heater surrounding the vessel to heat both the vessel and mercury bath.

The substrate may be mounted on a carbon susceptor and heated by an RF coil surrounding part of the vessel. Alternatively resistance heaters may be used inside the vessel, or an infra red heater may be caused to illuminate the substrate surface.

The compounds of Cd and Te may be supplied by passing high purity hydrogen through two bubblers containing the appropriate compounds of Cd and Te.

The invention will now be described, by way of example only with reference to the accompanying drawing which is a schematic flow diagram.

As shown high purity hydrogen is supplied to a hydrogen manifold 1 which maintains a supply for five mass-flow controllers 2, 3, 4, 5, and 23. Mass flow controller 2 supplies hydrogen via a bypass line 14 to a combustion chamber 31 which burns exhaust vapour in a hydrogen flame. Mass flow controllers 3 and 4 supply hydrogen to alkyl bubblers 6, and 7, which respectively contain an alkyl of cadmium such as dimethyl cadmium and an alkyl of tellurium such as diethyl telluride. Hydrogen flow from the controllers 3 and 4 can be diverted via valves 8 and 9 to the bypass line 14 or through valves 10, 11 and 12, 13 thus enabling the alkyl flows to be turned on and off. Hydrogen bubbling through the liquid alkyl will become saturated with alkyl vapours at the ambient temperature of the liquid alkyl, typically 25° C. These alkyl plus hydrogen streams are mixed in a mixer 15 with a further dilution flow of hydrogen supplied by the mass flow controller 5. By control of flows through controllers 3, 4, and 5, the concentrations of cadmium and tellurium alkyls in the mixed stream can be independently determined over a wide range of values.

The alkyl plus hydrogen mixture is passed into a reactor vessel 16 which is heated with an electrical resistance furnace 17 and R.F. induction coil 18. Inside the reactor vessel is a mercury bath 19 and a carbon susceptor 21 carrying the substrate 20 to be coated with a layer of CMT. The furnace maintains the temperature of the reactor vessel wall from the mercury reservoir 19 to the substrate 20 equal to or greater than the mercury reservoir temperature, the mercury reservoir being heated by thermal conduction through the reactor wall 24. The RF induction coil 18 couples into the carbon susceptor 21 thereby heating the substrate to a temperature above that of the reactor wall 24 so that the cadmium and tellurium alkyls will crack and deposit cadmium and tellurium onto the surface of the substrate 20. The temperature of the mercury reservoir 19 is determined by the requirement of an equilibrium partial pressure of mercury to be maintained at the growth interface. The hot reactor wall 24 ensures that the mercury partial pressure in the vapour stream is the same at the substrate 20 as over the mercury reservoir 19.

Typical conditions for growth of a layer of CMT on a CdTe substrate are: alkyl bubbler temperature 25° C.; vessel wall and mercury bath temperature 220°-320° C. (e.g. around 300° C.): substrate temperature 400°-430° C. (e.g. around 410° C.): Hydrogen dilution flow through controller 5 is around 500 ml/min: flow through Cd alkyl bubbler around 2-200 ml/min (e.g. 40 ml/min); flow through Te alkyl bubbler around 500-1100 ml/min (e.g. 1,000 ml/min). The walls of the vessel 16 are sufficiently hot to prevent condensation of Hg without significant decomposition of the alkyls, whilst the temperature of the substrate 20 is sufficient to decompose the alkyls at the substrate 20 surface. The substrate may be inclined slightly e.g. 4° to give more uniform growth along the substrate.

In one example a layer of $Cd_{0.2}Hg_{0.8}Te$ was grown on CdTe at 2° off the [100] orientation and inclined at 4° to the gas flow under the following conditions: alkyl bubbler temperature 25° C.; Hg temperature 290° C.; substrate temperature 410° C.; $H_2$ dilution flow 400 ml/min; Cd alkyl flow 50 ml/min; Te alkyl flow 950 ml/min.

A water cooling jacket 22 at one end of the vessel 16 condenses out the unreacted mercury and prevents overheating of reactor vessel and plate seals. The exhaust vapour stream is then mixed with the bypass 14 stream of hydrogen and burnt in the combustion chamber 31 for safety reasons.

A vacuum pump 30 is connected to the vessel 16 via a cold trap 29 for initial purging of the vessel 16.

The layer of CMT grown on the substrate may include one or more dopants. Such a dopant is provided by passing hydrogen from the manifold through a mass flow controller 23 to a bubbler 25 containing an alkyl of the dopant. Alternatively a volatile hydride of the dopant in hydrogen may be used. From the bubbler the alkyl passes to the mixer 15 and thence to the vessel 16. Valves 26, 27, 28 control the flow of hydrogen and alkyl.

Examples of dopants and their alkyls are as follows: Al, Ga, As, and P from the respective alkyls $(CH_3)_3Al$, $(CH_3)_3Ga$, $(CH_3)_3As$, $(CH_3)_3P$.

Examples of dopants and their hydrides are as follows: Si, Ge, As, and P from their respective hydrides $SiH_4$, $GeH_4$, $AsH_3$ and $PH_3$. A supply of the hydrides e.g. $SiH_4$ may be supplied direct from gas cylinders.

In a modification the cadmium and tellurium compounds may be supplied together or independently direct into the vessel 16 to mix above the substrate 20. These supplies may be via thermally-insulated tubes.

Using the above method and apparatus infra red detectors may be made. Such a detector may be a layer of CMT on a CdTe substrate with a passivating layer of oxide or CdTe on the CMT layer surface. The detector may be in the form of a strip with electrodes on the surface at each end as described in UK Patent Specification No. 1,488,258. Such a detector is photo conductive and has the image of a thermal scene scanned over its surface.

Another type of IR detector uses a p-n junction e.g. the junction between two differently doped, p and n doped, CMT layers to form a photo-voltaic detector. A voltage is applied by electrodes across the p-n junction and changes in current are a measure of the infra-red photons that are absorbed by the detector. Such a detector may be formed into a large array of IR detectors capable of imaging a thermal scene, without a scanning system, to form a so-called staring array system.

The materials $Cd_xHg_{1-x}Se$ and $Cd_xHg_{1-x}S$ may be grown in a manner analogous to that described above.

We claim:

1. A method of growing a layer of cadmium mercury telluride onto a substrate comprising the steps of:
   providing an atmosphere of mercury vapour at a required temperature and pressure inside a vessel;
   controlling the temperature of the substrate mounted in the vessel;
   providing a supply of a volatile cadmium alkyl into the vessel and onto the substrate;
   providing a supply of a volatile tellurium alkyl into the vessel and onto the substrate; and
   removing exhaust products from the vessel;
   the arrangement being such that the cadmium and the tellurium compounds decompose in the region of the substrate and the cadmium and tellurium combine with mercury on the substrate to form a layer of cadmium mercury telluride whose cadmium composition is controlled by the supply of cadmium and the overall composition of the cation content is controlled by the supply of tellurium compound, the mercury vapour pressure being held greater than the decomposition pressure of the growing layer.

2. The method of claim 1 wherein the cadmium alkyl is selected from the group dimethyl cadmium, diethyl cadmium, and dipropyl cadmium.

3. The method of claim 1 wherein the tellurium alkyl is selected from the group diethyl telluride, dimethyl telluride, dipropyl telluride, dibutyl telluride, or an equivalent hydrogen substituted telluride alkyl.

4. The method of claim 1 and further comprising the step of supplying a volatile dopant compound into the vessel to decompose on the substrate.

5. The method of claim 4 wherein the volatile dopant is selected from the alkyl group $(CH_3)_3Al$, $(CH_3)_3Ga$, $(CH_3)_3As$, $(CH_3)_3P$, or the hydride group $SiH_4$, $GeH_4$, $AsH_3$, $PH_3$.

* * * * *